(12) United States Patent
Kim et al.

(10) Patent No.: US 7,830,185 B2
(45) Date of Patent: Nov. 9, 2010

(54) DUTY CYCLE CORRECTION (DCC) CIRCUIT AND DELAYED LOCKED LOOP (DLL) CIRCUIT USING THE SAME

(75) Inventors: Su Hyun Kim, Cheongiu-si (KR); Min Young Yoo, Cheongiu-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/648,314

(22) Filed: Dec. 29, 2006

(65) Prior Publication Data
US 2008/0042705 A1   Feb. 21, 2008

(30) Foreign Application Priority Data
Jun. 29, 2006   (KR) .................. 10-2006-0059881

(51) Int. Cl.
*H03L 7/06* (2006.01)
(52) U.S. Cl. .................. 327/158; 327/147; 327/156; 327/161; 327/175
(58) Field of Classification Search .............. 327/158, 327/175
See application file for complete search history.

(56) References Cited

U.S. PATENT DOCUMENTS

| | | | |
|---|---|---|---|
| 6,642,760 B1 * | 11/2003 | Alon et al. ............ | 327/158 |
| 6,963,235 B2 * | 11/2005 | Lee ..................... | 327/158 |
| 7,095,261 B2 | 8/2006 | Drexler et al. | |
| 7,227,809 B2 * | 6/2007 | Kwak ................... | 365/189.15 |
| 7,282,958 B2 * | 10/2007 | Rhee ................... | 326/113 |
| 2004/0155686 A1 * | 8/2004 | Kim et al. ............. | 327/158 |
| 2005/0110540 A1 * | 5/2005 | Kwak .................. | 327/158 |
| 2006/0192602 A1 * | 8/2006 | Lee ..................... | 327/158 |
| 2007/0046347 A1 * | 3/2007 | Lee ..................... | 327/158 |
| 2007/0176659 A1 * | 8/2007 | Gomm ................. | 327/175 |

FOREIGN PATENT DOCUMENTS

| | | |
|---|---|---|
| KR | 10-2004-0021478 A | 3/2004 |
| KR | 10-2005-0055925 A | 6/2005 |
| KR | 10-2005-0079801 A | 8/2005 |
| KR | 10-2005-0082637 A | 8/2005 |
| KR | 10-2005-0087286 A | 8/2005 |
| KR | 10-2006-0037564 A | 5/2006 |

\* cited by examiner

*Primary Examiner*—Lincoln Donovan
*Assistant Examiner*—John W Poos
(74) *Attorney, Agent, or Firm*—John P. White; Cooper & Dunham LLP

(57) ABSTRACT

A duty cycle correction (DCC) circuit and a delayed locked loop (DLL) circuit using the same are disclosed. The DCC circuit is operated by an enable signal which is enabled when the DLL is locked. The duty cycle correction (DCC) circuit includes a clock input unit and a duty cycle mixing unit. The clock input unit receives the enable signal and first and second clock input signals having opposite phases, generates an inverting signal of the first clock input signal, and when the enable signal is enabled, generates first and second internal clock signals, based on the first and second clock input signals and the inverting signal. The duty cycle mixing unit mixes a phase of the first internal clock signal with a phase of the second internal clock signal.

10 Claims, 4 Drawing Sheets

DUTY CYCLE CORRECTION (DCC) CIRCUIT AND DELAYED LOCKED LOOP (DLL) CIRCUIT USING THE SAME

BACKGROUND

The present disclosure relates to a Duty Cycle Correction (DCC) circuit and a Delayed Locked Loop (DLL) circuit using the same, and more particularly to a DCC circuit for preventing an internal clock signal, in which a variation of internal delay elements created by an external factor (e.g., a power-supply voltage variation) is insufficiently reflected, from being generated, and a DLL circuit using the DCC circuit.

With the increasing degree of integration of a semiconductor memory, the semiconductor memory has been continuously improved to enhance its operation speed. In order to enhance the operation speed of the semiconductor memory, a synchronous memory device capable of being synchronized with a clock signal received from an external part of a memory chip has been recently introduced to the market.

However, if the above-mentioned synchronous memory synchronizes its data with the external clock signal, and outputs the synchronized result, an unexpected delay of "tAC" (output data Access time from Clk) occurs, and the number of valid data windows is reduced, such that an unexpected faulty operation occurs in the synchronous memory which is operating at high frequency. Therefore, in order to allow data to be correctly synchronized with a rising edge or a falling edge of the clock signal, a DLL circuit has been recently developed. The DLL circuit generates a DLL clock signal capable of delaying the external clock signal by a predetermined period denoted by "tCK-tAC", such that the data can be correctly synchronized with the rising-or falling-edge of the clock signal.

The above-mentioned DLL circuit generates an internal clock signal for compensating for internal delay elements of a DRAM by an external clock signal, and this operation of the DLL circuit is generally called a locking process.

FIG. 1A shows a block diagram illustrating a conventional DLL circuit 100.

Referring to FIG. 1A, the DLL circuit 100 is designed to perform a DCC (Duty Cycle Correction) operation. The DLL circuit 100 includes a clock buffer 110, a first/second DLL unit 120, a DCC unit 130, and a drive 140.

The DCC unit 130 includes a clock input unit 131. FIG. 1B is a conceptual diagram illustrating the clock input unit 131. Referring to FIG. 1B, the clock input unit 131 delays a first clock input signal (clk_r) by a predetermined period using a first delay 132, and generates a first internal clock signal (RCLK). The clock input unit 131 delays a second clock input signal (clk_f) by a predetermined period using a second delay 133, and generates a second internal clock signal (FCLK).

The above-mentioned DLL circuit 100 compares a phase of a reference clock signal (Ref clk) with a phase of a feedback clock signal (feedback clk). If a phase difference between the reference clock (Ref clk) and the feedback clock signal (feedback clk) is equal to or less than a predetermined delay period, it is determined that the locking occurs in the DLL unit 120. In this case, in order to reduce an amount of current consumption at the DLL unit 120, the second DLL 122 for generating the second clock input signal (clk_f) is switched off.

Under the above-mentioned situation, if a power-supply voltage is abruptly changed, an unexpected variation occurs in the DRAM intern al delay element, such that the locking of the DLL unit 120 is broken. If the locking state of the DLL unit 120 is broken, the first DLL 121 of the ON state recovers the locking state by an update process, and generates the first clock input signal (clk_r) in which the above-mentioned DRAM internal delay element's variation is reflected. However, the second DLL 122 of the OFF state does not recover the locking state, such that the second DLL 122 generates the second clock input signal (clk_f) in which the DRAM internal delay element's variation is not reflected.

As a result, the above-mentioned DLL circuit must unavoidably synchronize data with a DLL clock signal created by the second internal clock signal (FCLK) in which the internal delay element is insufficiently reflected, such that it unavoidably increases the delay time denoted by "tAC" (output data Access time from Clk).

BRIEF SUMMARY

The present disclosure relates to a Duty Cycle Correction (DCC) circuit for preventing an internal clock signal, in which a variation of internal delay elements created by an external factor (e.g., a power-supply voltage variation) is insufficiently reflected, from being generated, and a DLL circuit using the DCC circuit.

In one embodiment, a duty cycle correction (DCC) circuit comprises a clock input unit configured to receive first and second clock input signals and an enable signal, generate an inverting signal of the first clock input signal and when the enable signal is enabled, generate first and second internal clock signals, based on said first and second clock input signals and said inverting signal, and a duty cycle mixing unit for mixing a phase of the first internal clock signal with a phase of the second internal clock signal.

Preferably, the clock input unit includes a first delay for delaying the first clock input signal by a predetermined period, and generating the first internal clock signal, a multiplexer for receiving the inverting signal of the first clock input signal and a second clock input signal, and multiplexing the inverting signal and the second clock input signal when the enable signal is enabled, and a second delay for delaying an output signal of the multiplexer by a predetermined period, and generating the second internal clock signal.

Preferably, the multiplexer includes a first transfer gate for transmitting the inverting signal of the first clock input signal to an output node when the enable signal is in a first state, and a second transfer gate for transmitting the second clock input signal to the output node when the enable signal is in a second state, wherein the first and second transfer gates are selectively switched on by the enable signal.

Preferably, the multiplexer further includes a first buffer for buffering the inverting signal of the first clock input signal, a second buffer for buffering the second clock input signal, and a third buffer for buffering a signal of the output node.

Preferably, the first, second, and third buffers are inverters, respectively.

In another embodiment, a delayed locked loop (DLL) circuit comprises a clock buffer for buffering external clock signals, and generating an internal clock signal, a delayed locked loop (DLL) unit for generating first and second clock input signals using the internal clock signal, a clock input unit coupled to the delayed locked loop (DLL) unit to receive the first and second clock input signals, and configured to receive an enable signal, generate an inverting signal of the first clock input signal, and when the enable signal is enabled, generate first and second internal clock signals, based on said first and second clock input signals and said inverting signal, and a duty cycle correction (DCC) unit for mixing phases of the first and second internal clock signals generated from the clock input unit, and generating a phase mixing signal.

Preferably, the delayed locked loop (DLL) unit includes a first DLL which includes a delay line for delaying a phase of the internal clock signal by a first delay period, and generating the first clock input signal, an internal delay for delaying a phase of the first clock input signal by a second delay period determined by a DLL internal delay element, and generating a feedback clock signal, and a phase detector for comparing a phase of the feedback clock signal with the phase of the internal clock signal, and generating a control signal for adjusting the first delay period.

Preferably, the delayed locked loop (DLL) unit includes a second DLL which includes a delay line for delaying a phase of the internal clock signal by a first delay period, buffering the delayed internal clock signal, and generating the second clock input signal having a phase opposite to that of the first clock input signal, an internal delay for delaying a phase of the second clock input signal by a second delay period determined by a DLL internal delay element, and generating a feedback clock signal, and a phase detector for comparing a phase of the feedback clock signal with a phase of the internal clock signal, and generating a first control signal for adjusting the first delay period.

BRIEF DESCRIPTION OF THE DRAWINGS

The above and other objects, features and other advantages of the subject matter of the present disclosure will be more clearly understood from the following detailed description taken in conjunction with the accompanying drawings, in which.

DESCRIPTION OF SPECIFIC PREFERRED EMBODIMENTS

Figure 1A:
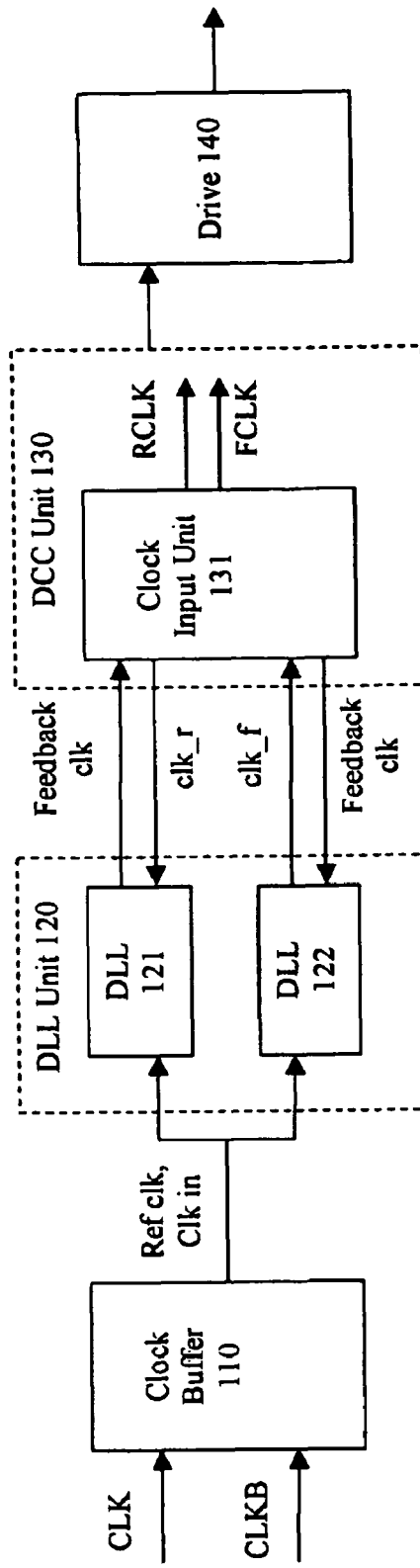
FIG. 1A is a block diagram illustrating a conventional DLL circuit.
Figure 1B:
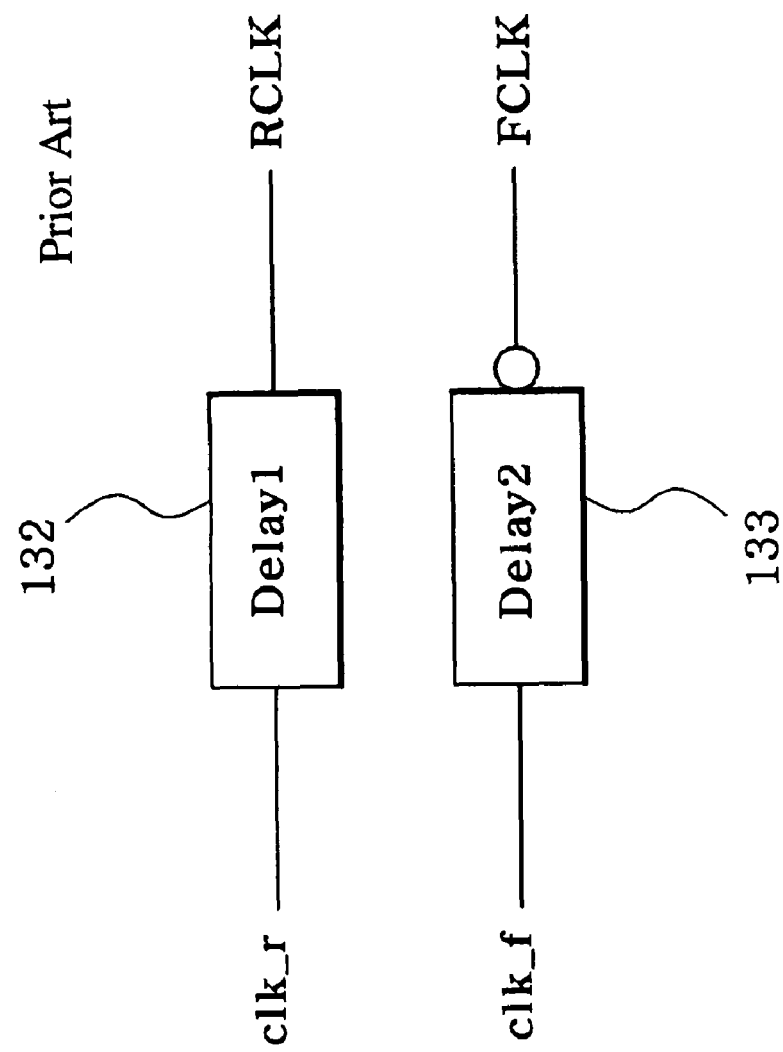
FIG. 1B shows a conceptual diagram illustrating a clock input unit contained in a conventional DCC circuit.

Specific preferred embodiments of the present disclosure will be described in detail with reference to the annexed drawings. In the drawings, the same or similar elements are denoted by the same reference numerals even though they are depicted in different drawings. In the following description, a detailed description of known functions and configurations incorporated herein will be omitted when it may make the subject matter of the present disclosure rather unclear.

Figure 2:
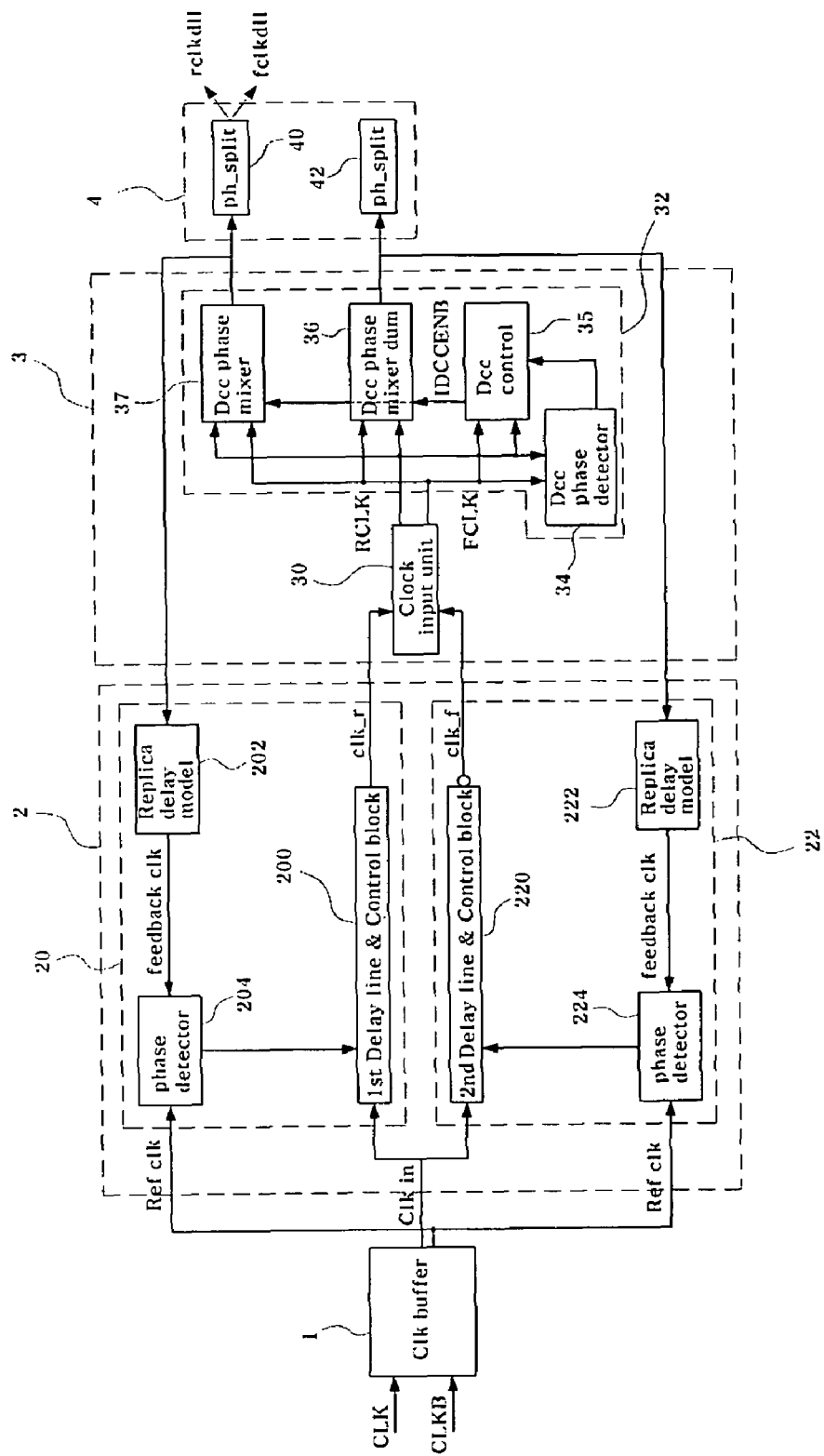
FIG. 2 shows a DLL circuit according to a preferred embodiment of the present disclosure.
Figure 3:
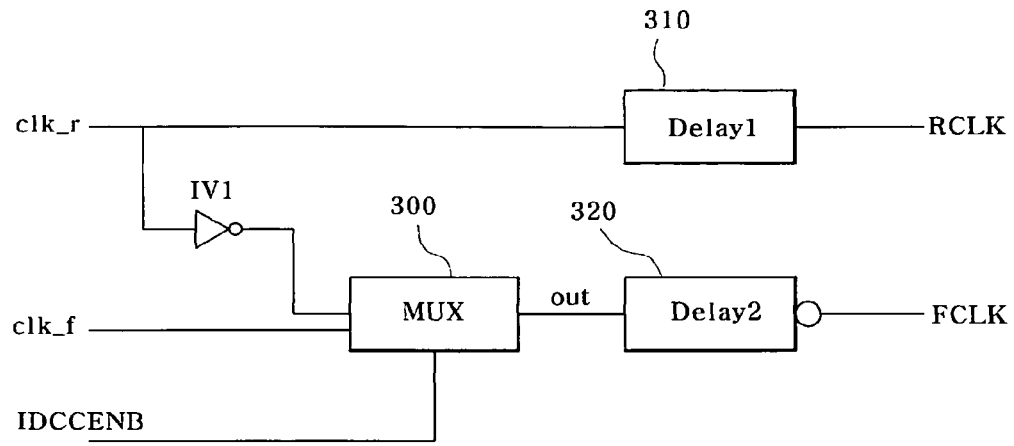
FIG. 3 shows a block diagram illustrating a clock input unit of a DCC circuit according to a preferred embodiment of the present disclosure.
Figure 4:
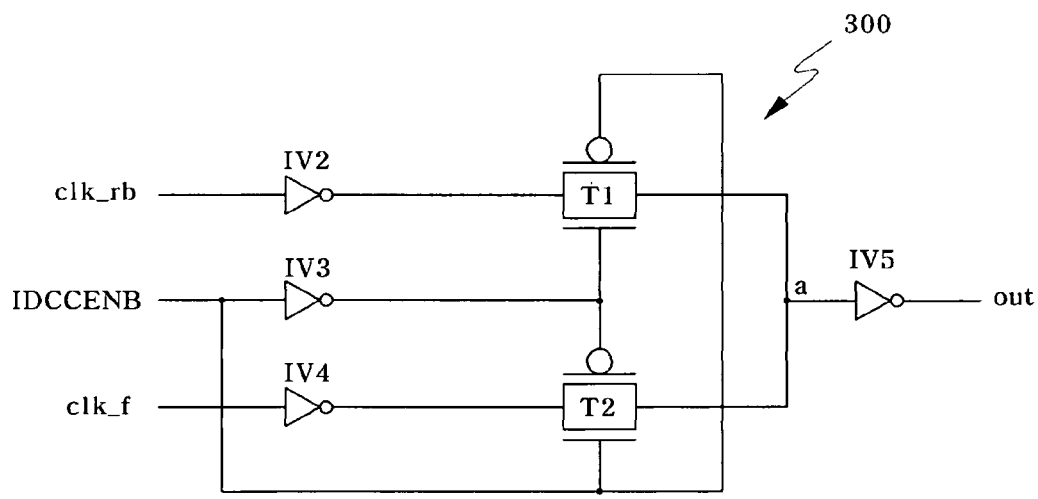
FIG. 4 shows a circuit diagram illustrating a multiplexer shown in FIG. 3.

FIG. 2 shows a DCC circuit according to a preferred embodiment of the present disclosure. FIG. 3 shows a circuit diagram illustrating a clock input unit of a DCC circuit according to a preferred embodiment of the present disclosure. FIG. 4 is a circuit diagram illustrating an example of the multiplexer shown in FIG. 3.

Referring to FIG. 2, the DLL circuit according to the preferred embodiment of the present disclosure includes a clock buffer 1, a DLL unit 2, a DCC unit 3, and a drive 4.

The clock buffer 1 buffers external clock signals (CLK and CLKB), and generates an internal clock signal (Clk in).

The DLL unit 2 delays a phase of the internal clock signal (Clk in) by a predetermined period, and generates a first clock input signal (clk_r) and a second clock input signal (clk_f) having a phase opposite to that of the first clock input signal (clk_r).

The DCC unit 3 includes a clock input unit 30 and a duty cycle mixing unit 32. FIG. 3 shows a detailed view of the clock input unit 30. The clock input unit 30 receives the first and second clock input signals (clk_r and clk_f) and an enable signal (IDCCENB) enabled when the DLL unit 2 is locked, generates the first and second internal clock signals RCLK and FCLK. If the enable signal (IDCCENB) is enabled, the clock input unit 30 generates the first and second internal clock signals (RCLK and FCLK) upon receiving the first clock input signal (clk_r) and an inverting signal of the first clock input signal (clk_r). The duty cycle mixing unit 32 mixes phases of the first and second internal clock signals (RCLK and FCLK) generated by the clock input unit 30 with each other, and generates a phase mixing signal.

The drive 4 separates the phase mixing signal from the signal received from the DCC unit 3, and generates first and second DLL clock signals (rclkdll and fclkdll), each of which has an adjusted duty cycle.

The first DLL 20 contained in the DLL unit 2 includes a delay line 200, an internal delay 202, and a phase detector 204. The delay line 200 delays the phase of the internal clock signal (Clk in) by a first delay period, and generates the first clock input signal (clk_r). The internal delay 202 delays the phase of the first clock input signal (clk_r) by a second delay period determined by a DLL internal delay element, and generates a feedback clock signal (feedback clk). The phase detector 204 compares a phase of the feedback clock signal (feedback clk) with a phase of the reference clock signal (Ref clk) generated by the internal clock signal (Clk in), and generates a control signal for adjusting the first delay period.

In this case, the internal delay element for determining the second delay period is generated by the external clock signals (CLK and CLKB) reaching the delay line 200, or is generated by an internal clock signal flowing toward the outside. The above-mentioned control signal enters a control block contained in the delay line 200, such that it determines the first delay period.

The second DLL 22 contained in the DLL unit 2 includes a delay line 220, an internal delay 222, and a phase detector 224. The delay line 220 delays the phase of the internal clock signal (Clk in) by a first delay period, and generates the second clock input signal (clk_f). The internal delay 222 delays the phase of the second clock input signal (clk_f) by a second delay period determined by a DLL internal delay element, and generates a feedback clock signal (feedback clk). The phase detector 224 compares a phase of the feedback clock signal (feedback clk) with a phase of the reference clock signal (Ref clk) generated by the internal clock signal (Clk in), and generates a control signal for adjusting the first delay period.

Referring to FIG. 3, the clock input unit 30 includes a first delay 310, a multiplexer 300, and a second delay 320. The first delay 310 delays the first clock input signal (clk_r) by a predetermined period, and generates the first internal clock signal (RCLK). The multiplexer 300 receives a buffering signal of the first internal clock signal (RCLK) and the second clock input signal (FCLK), and performs multiplexing of the received signals when the enable signal (IDCCENB) is enabled. The second delay 320 delays an output signal (out) of the multiplexer 300 by a predetermined period, and generates the second internal clock signal (FCLK).

Referring to FIG. 4, the multiplexer 300 includes a first inverter (IV2), a second inverter (IV4), a first transfer gate (T1), a second transfer gate (T2), and a third inverter (IV5). The first inverter (IV2) buffers the inverting signal (clk_rb) of the first clock input signal. The second inverter (IV4) buffers the second clock input signal (clk_f). The first transfer gate (T1) responds to a first state of the enable signal (IDCCENB), and transmits the output signal of the first inverter (IV2) to an output node (a). The second transfer gate (T2) responds to a second state of the enable signal (IDCCENB), and transmits the output signal of the second inverter (IV4) to the output node (a). The third inverter (IV5) inversely buffers the signal of the output node (a).

Operations of the above-mentioned DLL circuit according to the preferred embodiment the present disclosure will hereinafter be described with reference to FIGS. 2-4.

Firstly, the locking process will be described in detail.

Referring to FIG. 2, the clock buffer (Clk buffer) 1 receives the external clock signal (CLK and CLKB), and generates the internal clock signal (Clk in). The internal clock signal (Clk in) is applied to the first and second delay lines 200 and 220, and the first and second delay lines 200 and 220 delay the internal clock signal (Clk in) by respective predetermined delay periods. The first delay line 200 generates the first clock input signal (clk_r), and the second delay line 220 generates the second clock input signal (clk_f) having a phase opposite to that of the first clock input signal (clk_r). The reason why the first and second clock input signals (clk_r and clk_f) having opposite phases are generated from the first and second delay lines 200 and 220 is that only the second delay line 220 inverts the internal clock signal (Clk in) delayed by the predetermined period. For the convenience of description, a small-sized circle (i.e., a bubble) depicted at an output terminal of the second delay line 220 indicates the inversion of the output signal.

Referring to FIGS. 3 and 4, the clock input unit 30 receives the first and second clock input signals (clk_r and clk_f), and generates the first and second internal clock signals (RCLK and FCLK).

In this case, the first internal clock signal (RCLK) indicates that the first clock input signal (clk_r) is delayed by the first delay 310 by a predetermined time (i.e., a predetermined period). The second internal clock signal (FCLK) indicates that the second clock input signal (clk_f) is delayed by the second delay 320 by a predetermined time (i.e., a predetermined period) in the same manner as in the conventional art. In more detail, the transfer gate (T2) of the multiplexer 300 is switched on by a high-level enable signal (IDCCENB) until reaching the locking state, and the second clock input signal (clk_f) is transmitted to the output node (a) via the switched-ON transfer gate (T2), such that the second clock input signal (clk_f) delayed by the second delay 320 occurs.

The duty cycle phase mixing units 36 and 37 receive the high-level enable signal (IDCCENB) until entering the locking state, such that they are inactivated. The first and second internal clock signals (RCLK and FCLK) applied to the duty cycle phase mixing units 36 and 37 are bypassed, such that they are applied to the first and second internal delays 202 and 222.

The first and second internal delays 202 and 222 delay the first and second internal clock signals (RCLK and FCLK) by a predetermined period, and generate feedback clock signals (feedback clk), respectively. The feedback clock signals (feedback clk) generated by the first and second internal delays 202 and 222 are applied to the phase detectors 204 and 224, respectively.

The phase detectors 204 and 224 compare the phase of the feedback clock signal (feedback clk) with the phase of the reference clock signal (Ref clk) generated by the clock buffer 1, and generate a control signal for adjusting individual delay periods of the first and second delay lines 200 and 220. The above-mentioned control signal is applied to the control block contained in the first and second delay lines 200 and 220, and determines delay periods of the internal clock signals (Clk in) transmitted to the first and second delay lines 200 and 220.

However, if the phase of the feedback clock signal (feedback clk) and the phase of the reference clock signal (Ref clk) are contained in a predetermined delay period, the phase detectors 204 and 224 determine the occurrence of the locking state, and enable the above-mentioned enable signal (IDCCENB). Under the above-mentioned locking state, the first and second internal clock signals (RCLK and FCLK) generated by the clock input unit 30 have the same rising edge whereas they have opposite duty cycles.

In the meantime, as previously stated in the conventional art, the conventional art switches off the second DLL 22 for generating the second internal clock signal (clk_f) in order to reduce an amount of current consumption required for adjusting the duty cycle after the above-mentioned locking process.

However, provided that an unexpected variation occurs in the DRAM's internal delay element due to the abrupt change of the power-supply voltage (VDD), and the locking state of the DLL unit 2 is broken, the second DLL 22 of the OFF state does not recover the locking state, and generates the second clock input signal (clk_f) in which the variation of the above-mentioned internal delay element is not reflected. In order to solve the above-mentioned problem, the clock input unit 30 generates the second internal clock signal (FCLK) using the first clock input signal (clk_r) generated from the ON-state first DLL 200, and a detailed description thereof will hereinafter be described.

If the first and second DLLs 20 and 22 are locked, the enable signal (IDCCENB) for activating the DCC unit 3 enters a logic low level. In this case, the enable signal (IDCCENB) is generated from a duty cycle controller 35, and is applied to the duty cycle phase mixing units 36 and 37 and the clock input unit 30.

The clock input unit 30 receives the first and second clock input signals (clk_r and clk_f) and the enable signal (IDCCENB), and generates the first and second internal clock signals (RCLK and FCLK). Referring to FIG. 3, the clock input unit 30 commands the first delay 310 to delay the first clock input signal (clk_r) by a predetermined period, such that it generates the first internal clock signal (RCLK). The clock input unit 30 commands the multiplexer 300 to perform multiplexing of the inverting signal (clk_rb) of the first clock input signal and the second clock input signal (clk_f) according to the enable signal (IDCCENB). The clock input unit 30 commands the second delay 320 to delay the output signal (out) of the multiplexer 300 by a predetermined period, such that it generates the second internal clock signal (FCLK). A process for generating the second internal clock signal (FCLK) will hereinafter be described. After the locking is executed, the enable signal (IDCCENB) enters a logic low level, and the transfer gate (T1) is switched on, such that the inverting signal (clk_rb) of the first clock input signal is generated from the multiplexer 300. Therefore, the second internal clock signal (FCLK) is generated when the inverting signal (clk_rb) of the first clock input signal is delayed by a predetermined period.

As described above, under the locking state, the clock input unit 30 generates the second internal clock signal (FCLK) using the inverting signal (clk_rb) of the first clock input signal generated from the ON-state first DLL 30, instead of using the second clock input signal (clk_f) of the second DLL 22 switched off to reduce the amount of current consumption. The reason why the clock input unit 30 generates the second internal clock signal (FCLK) using the inverting signal (clk_rb) of the first clock input signal is that the first DLL 20 can recover the locking state by performing the update process even when an unexpected variation occurs in the DRAM internal delay element due to the abrupt variation of the power-supply voltage (VDD).

In other words, the clock input unit 30 generates the first and second internal clock signals (RCLK and FCLK) using not only the first clock input signal (clk_r) generated from the first DLL 20 capable of maintaining the locking state, but also the inverting signal (clk_rb) of the first clock input signal (clk_r), such that the clock input unit 30 can reflect the variation of the DRAM internal delay element in the first and second internal clock signals (RCLK and FCLK).

The first and second internal clock signals (RCLK and FCLK) are applied to the duty cycle mixing unit 32 enabled by the enable signal (IDCCENB), and phases of the first and second internal clock signals (RCLK and FCLK) are mixed with each other, such that the duty cycle mixing unit 32 outputs a phase mixing signal.

The drive 4 receives the phase mixing signal from the duty cycle mixing unit 32, and separates the received phase mixing signal while being classified according to individual phases, such that it generates the first and second DLL clock signals (rclkdll and fclkdll), each of which has an adjusted duty cycle. As a result, each of the first and second DLL clock signals (rclkdll and fclkdll) created by the above-mentioned phase mixing operation has the duty ratio of exactly 50%.

As apparent from the above description, the clock input unit 30 of the preferred embodiment of the present disclosure receives the clock input signal generated from the ON-state DLL under the locking state and the inverting signal of the clock input signal, and generates an internal clock signal applied to the DCC circuit using the clock input signal and the inverting signal, such that it can prevent a poor internal clock signal, in which a variation of internal delay elements created by an external factor (e.g., a power-supply voltage variation) is insufficiently reflected, from being generated.

The subject matter of the present disclosure synchronizes data with a DLL clock signal created by the internal clock signal in which the internal delay elements are properly reflected, such that it prevents a delay time of "tAC" from being increased.

Although the specific embodiments of the present disclosure have been disclosed for illustrative purposes, those skilled in the art will appreciate that various modifications, additions and substitutions are possible, without departing from the scope and spirit of the disclosure and the accompanying claims.

The present application claims priority to Korean patent application No. 10-2006-0059881, filed on Jun. 29, 2006, which is incorporated in its entirety by reference.

What is claimed is:

1. A duty cycle correction (DCC) circuit comprising:
    a first delay configured to receive a first clock input signal, delay the first clock input signal by a predetermined period, and generate a first internal clock signal;
    a multiplexer configured to receive the inverting signal of the first clock input signal and a second clock input signal, and output one of the inverting signal of the first clock input signal or the second clock input signal in response to an enable signal, wherein the enable signal is enabled when a delayed locked loop (DLL) unit is locked;
    a second delay for delaying an output signal of the multiplexer by a predetermined period, and generating a second internal clock signal; and
    a duty cycle mixing unit for mixing a phase of the first internal clock signal with a phase of the second internal clock signal,
    wherein the first clock input signal is out of phase with the output signal of the multiplexer.

2. The duty cycle correction (DCC) circuit according to claim 1, wherein the multiplexer includes:
    a first transfer gate for transmitting the inverting signal of the first clock input signal to an output node when the enable signal is in a first state; and
    a second transfer gate for transmitting the second clock input signal to the output node when the enable signal is in a second state,
    wherein the first and second transfer gates are selectively switched on by the enable signal.

3. The duty cycle correction (DCC) circuit according to claim 2, wherein the multiplexer further includes:
    a first buffer for buffering the inverting signal of the first clock input signal;
    a second buffer for buffering the second clock input signal; and
    a third buffer for buffering a signal of the output node.

4. The duty cycle correction (DCC) circuit according to claim 3, wherein the first, second, and third buffers are respective inverters.

5. A delayed locked loop (DLL) circuit comprising:
    a clock buffer configured to buffer external clock signals, and generate an internal clock signal;
    a delayed locked loop (DLL) unit coupled to the clock buffer to generate first and second clock input signals using the internal clock signal;
    a first delay configured to receive a first clock input signal, delay the first clock input signal by a predetermined period, and generate a first internal clock signal;
    a multiplexer configured to receive an inverting signal of the first clock input signal and the second clock input signal, and output one of the inverting signal of the first clock input signal and the second clock input signal in response to an enable signal, wherein the enable signal is enabled when the delayed locked loop (DLL) unit is locked;
    a second delay for delaying an output signal of the multiplexer by a predetermined period, and generating a second internal clock signal; and
    a duty cycle correction (DCC) unit for mixing phases of the first and second internal clock signals generated by the clock input unit, and generating a phase mixing signal,
    wherein the first clock input signal is out of phase with the output signal of the multiplexer.

6. The delayed locked loop (DLL) circuit according to claim 5, wherein the delayed locked loop (DLL) unit includes a first DLL including:
    a delay line for delaying a phase of the internal clock signal by a first delay period, and generating the first clock input signal;
    an internal delay for delaying a phase of the first clock input signal by a second delay period determined by a DLL internal delay element, and generating a feedback clock signal; and a phase detector for comparing a phase of the feedback clock signal with the phase of the internal clock signal, and generating a control signal for adjusting the first delay period.

7. The delayed locked loop (DLL) circuit according to claim 5, wherein the delayed locked loop (DLL) unit includes a second DLL including:

a delay line for delaying a phase of the internal clock signal by a first delay period, buffering the delayed internal clock signal, and generating the second clock input signal having a phase opposite to that of the first clock input signal;

an internal delay for delaying a phase of the second clock input signal by a second delay period determined by a DLL internal delay element, and generating a feedback clock signal; and a phase detector for comparing a phase of the feedback clock signal with a phase of the internal clock signal, and generating a first control signal for adjusting the first delay period.

8. The delayed locked loop (DLL) circuit according to claim 5, wherein the multiplexer includes:

a first transfer gate for transmitting the inverting signal of the first clock input signal to an output node when the enable signal is in a first state; and a second transfer gate for transmitting the second clock input signal to the output node when the enable signal is in a second state, wherein the first and second transfer gates are selectively switched on by the enable signal.

9. The delayed locked loop (DLL) circuit according to claim 8, wherein the multiplexer further includes:

a first buffer for buffering the inverting signal of the first clock input signal;

a second buffer for buffering the second clock input signal; and a third buffer for buffering a signal of the output node.

10. The delayed locked loop (DLL) circuit according to claim 9, wherein the first, second, and third buffers are respective inverters.

* * * * *